(12) United States Patent
Lin et al.

(10) Patent No.: US 8,235,551 B2
(45) Date of Patent: Aug. 7, 2012

(54) LED MODULE AND PACKAGING METHOD THEREOF

(75) Inventors: Jian-Shian Lin, Yilan County (TW); Chieh-Lung Lai, Taichung County (TW); Hsiu-Jen Lin, Taipei County (TW); Weng-Jung Lu, Hsinchu (TW); Yi-Ping Huang, Taoyuan County (TW); Ya-Chun Tu, Taipei County (TW)

(73) Assignee: Industrial Technology Research Institute, Hsin-Chu (TW)

( * ) Notice: Subject to any disclaimer, the term of this patent is extended or adjusted under 35 U.S.C. 154(b) by 272 days.

(21) Appl. No.: 12/634,468

(22) Filed: Dec. 9, 2009

(65) Prior Publication Data

US 2010/0157595 A1 Jun. 24, 2010

(30) Foreign Application Priority Data

Dec. 24, 2008 (TW) .............................. 97150385 A
Jan. 6, 2009 (TW) .............................. 98100152 A
Jan. 15, 2009 (TW) .............................. 98101324 A
Sep. 29, 2009 (TW) .............................. 98132874 A

(51) Int. Cl.
*F21S 4/00* (2006.01)
*F21V 21/00* (2006.01)
*H01L 23/48* (2006.01)

(52) U.S. Cl. ......... 362/249.04; 362/249.03; 362/249.07; 257/696; 257/E23.047; 257/E23.048

(58) Field of Classification Search ............. 362/249.04, 362/249.03, 249.07; 257/696, E23.047, E23.048
See application file for complete search history.

(56) References Cited

U.S. PATENT DOCUMENTS

| | | | | |
|---|---|---|---|---|
| 4,984,057 | A * | 1/1991 | Mii | 257/692 |
| 5,084,804 | A * | 1/1992 | Schairer | 362/459 |
| 5,838,247 | A | 11/1998 | Bladowski | |
| 6,936,855 | B1 * | 8/2005 | Harrah | 257/88 |
| 7,201,511 | B2 * | 4/2007 | Moriyama et al. | 362/646 |
| 7,241,038 | B2 * | 7/2007 | Naniwa et al. | 362/525 |
| 7,285,903 | B2 * | 10/2007 | Cull et al. | 313/500 |
| 7,690,813 | B2 * | 4/2010 | Kanamori et al. | 362/249.02 |
| 7,918,575 | B2 * | 4/2011 | Ho | 362/97.3 |
| 8,100,553 | B2 * | 1/2012 | Chen et al. | 362/240 |

(Continued)

FOREIGN PATENT DOCUMENTS

CN 1692248 A 11/2005

(Continued)

OTHER PUBLICATIONS

Japan Patent Office, "Office Action", Oct. 4, 2011, Japan.

(Continued)

*Primary Examiner* — Thomas M. Sember
*Assistant Examiner* — David J Makiya
(74) *Attorney, Agent, or Firm* — Morris Manning & Martin LLP; Tim Tingkang Xia, Esq.

(57) ABSTRACT

A light-emitting diode (LED) module and an LED packaging method. As the LED module is packaged under the consideration of candela distribution, each of the lead frames of the LED chips packaged in the LED module is bended for tilting the LED chips by different angles to exhibit various lighting effects. Meanwhile, in the LED packaging method, a plurality of LED chips can be loaded on board rapidly and aligned by one operation to result in less deviation in the candela distribution curve.

12 Claims, 14 Drawing Sheets

U.S. PATENT DOCUMENTS

| | | | |
|---|---|---|---|
| 8,136,963 B2 * | 3/2012 | Wang | 362/249.08 |
| 2006/0139933 A1 | 6/2006 | Lin et al. | |
| 2006/0232976 A1 | 10/2006 | Lin et al. | |
| 2008/0002100 A1 * | 1/2008 | Kaneko et al. | 349/65 |

FOREIGN PATENT DOCUMENTS

| | | |
|---|---|---|
| CN | 101170154 A | 4/2008 |
| JP | 2004532532 A | 10/2004 |
| JP | 2006093359 A | 4/2006 |
| KR | 20070082614 A | 8/2007 |
| KR | 20080023389 A | 3/2008 |
| KR | 20080027535 A | 3/2008 |
| KR | 20080047822 A | 5/2008 |

OTHER PUBLICATIONS

State Intellectual Property Office of the People'S Republic of China, "Office Action", Apr. 22, 2011, China.

Korean Intellectual Proprty Office, "Office Action", Jan. 4, 2012, Korea.

\* cited by examiner

LED MODULE AND PACKAGING METHOD THEREOF

TECHNICAL FIELD

The disclosure generally relates to an LED module and a packaging method thereof and, more particularly, to an LED module and an LED packaging method, wherein the LED module is packaged under the consideration of candela distribution and each of the lead frames of the LED chips packaged in the LED module is bended for tilting the LED chips by different angles to exhibit various lighting effects without using additional light control elements. Meanwhile, in the LED packaging method, a plurality of LED chips can be loaded on board rapidly and aligned by one operation to result in less deviation in the candela distribution curve.

TECHNICAL BACKGROUND

In the field of lighting, light-emitting diodes (LED's) are becoming more and more popular because they are advantages as being compact, high-efficiency, durable and diverse in colors. Unlike conventional lighting elements, an LED lamp generally comprises a plurality of LED ships arranged in an array because a single LED ship is small and emits light of relatively insufficient intensity. Moreover, the light from an LED is directional. In an LED lamp, the LED chips are usually arranged inclined or are provided with light control elements to meet the requirements of a candela distribution curve. However, it costs higher when the LED chips are arranged inclined because additional molds are required and the assembly cost rises, which leads to higher cost and lower popularity of the LED lamp. Moreover, the use of light control elements reduces the light-emitting efficiency, which can be compensated by increased numbers of LED chips with more electricity consumed and higher lamp cost.

Conventionally, to meet the requirements of a candela distribution curve, the LED lamp uses light control elements such as light control lenses, geometrical reflecting screens and LED devices that are arranged to correct the candela distribution curve of the LED lamp.

U.S. Pat. Pub. No. 2006/0232976 discloses a lighting device with an integration sheet as shown in FIG. 1. The lighting device comprises a light source 21 and at least a sheet 22. The light source 21 comprises a luminous body 211 and a reflecting screen 212. The sheet 22 is disposed at the light-emitting end of the light source 21. The sheet 22 comprises a plurality of light diffusion zones 221, 222, 223. Each of the light diffusion zones 221, 222, 223 has a plural arrays of microstructures arranged on the surface thereof and each array of microstructures is capable of changing the diopter of the corresponding light diffusion zone. By controlling the distribution of the plural arrays of microstructures, the Gaussian distribution of the light source 21 can be improved while collimating the scattered light beams to the intended illuminating area 9 of the lighting device and diffusing the light beams emitting from the center of the light source 21 to the same so that not only the luminous efficacy of the lighting device is enhanced, but also the uniformity of the illuminance of the lighting device is improved.

U.S. Pat. Pub. No. 2006/0139933 discloses a reflector with negative focal length as shown in FIG. 2. The top of the luminaire screen 20 is a reflector of single negative focal length 51, such that the cross section of the luminaire screen 20 is a concavity with a side screen 52 connecting to the edge of the reflector 51. By the luminaire screen 20 of FIG. 2, the upward-incident rays emitting from a light source 53 are first reflected to the side screen 52 by the reflector 51, and then are further reflected such that a plurality of discharging rays 54 are generated. It is noted that the discharging rays 54 are discharge out of the luminaire by large angles for reducing glare. In addition, the height of the luminaire can be reduced.

U.S. Pat. No. 5,838,247 discloses a solid state light system as shown in FIG. 3. In FIG. 3, a lamp 40 has a plurality of inclined lamps 12 with a reflector 44 inclined at a complementary angle A, so as to direct the light parallel to the polar axis 36 of lamp 40. The angle of convergence or divergence may vary, with the angle of the reflector correspondingly selected to achieve the desired direction and type of light output.

SUMMARY

In view of the above, this disclosure provides an LED module and an LED packaging method, wherein the LED module is packaged under the consideration of candela distribution and thus each of the lead frames of the LED chips packaged in the LED module is bended for tilting the LED chips by different angles to exhibit various lighting effects without using additional light control elements.

In one embodiment, this disclosure provides an LED module, comprising: a plurality of lead frames, each being bended by a predetermined angle according to a candela distribution curve to construct a tilted plane; and a plurality of LED chips, each being fixedly disposed on the tilted plane constructed by each of the lead frames.

In another embodiment, this disclosure provides an LED packaging method, comprising steps of: forming a bonding metal material or metal colloidal particles on a lead frame; placing a LED chip on the bonding metal material or the metal colloidal particles; heating up the lead frame so that the LED chip is bonded with the lead frame by the bonding metal material or the metal colloidal particles; performing an interconnect bonding process on the LED chip; bending the lead frame by a predetermined angle according to a candela distribution curve to construct a tilted plane; performing an encapsulation process and a baking process on the bended lead frame and the LED chip to form a three-dimensional LED module; and performing a testing process on the three-dimensional LED module.

In another embodiment, this disclosure provides an LED module, comprising: a plurality of lead frames, being bendable; and a plurality of LED chips, each being fixedly disposed on the lead frames; and a substrate, being disposed under and electrically coupled to the lead frames.

In another embodiment, this disclosure provides an LED packaging method, comprising steps of: forming a bonding metal material or metal colloidal particles on a lead frame; placing an LED chip on the bonding metal material or the metal colloidal particles; heating up the lead frame so that the LED chip is bonded with the lead frame by the bonding metal material or the metal colloidal particles; performing an interconnect bonding process on the LED chip; aligning and bonding the lead frame and the substrate; performing an encapsulation process and a baking process on the lead frame and the substrate to form an LED module; and performing a testing process on the LED module.

BRIEF DESCRIPTION OF THE DRAWINGS

The embodiments of the disclosure will be readily understood by the accompanying drawings and detailed descriptions, wherein.

DETAILED DESCRIPTION OF EMBODIMENTS

The disclosure can be exemplified by but not limited to various embodiments as described hereinafter.

Figure 1:
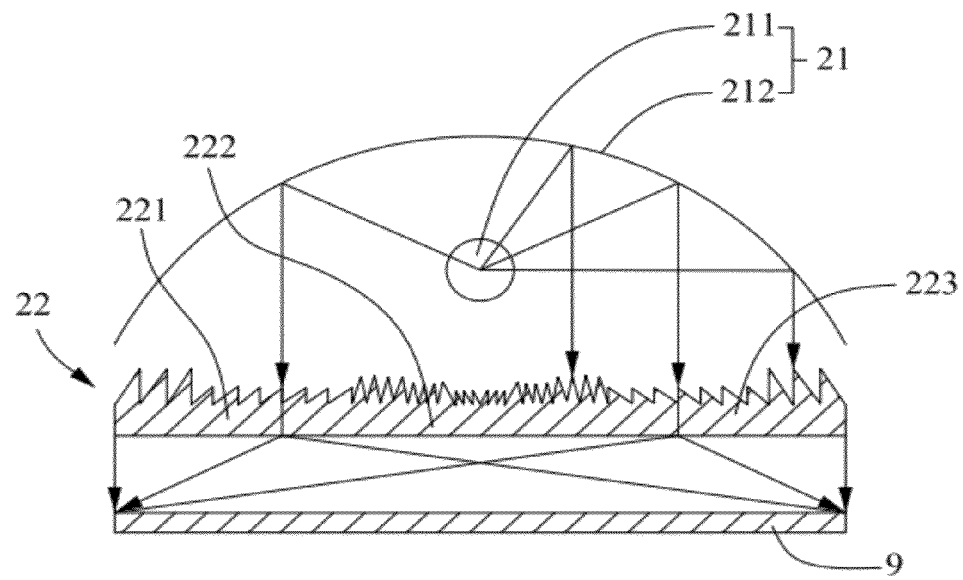
FIG. 1 is a structural diagram of a conventional lighting device with an integration sheet in U.S. Pat. Pub. No. 2006/0232976.
Figure 2:
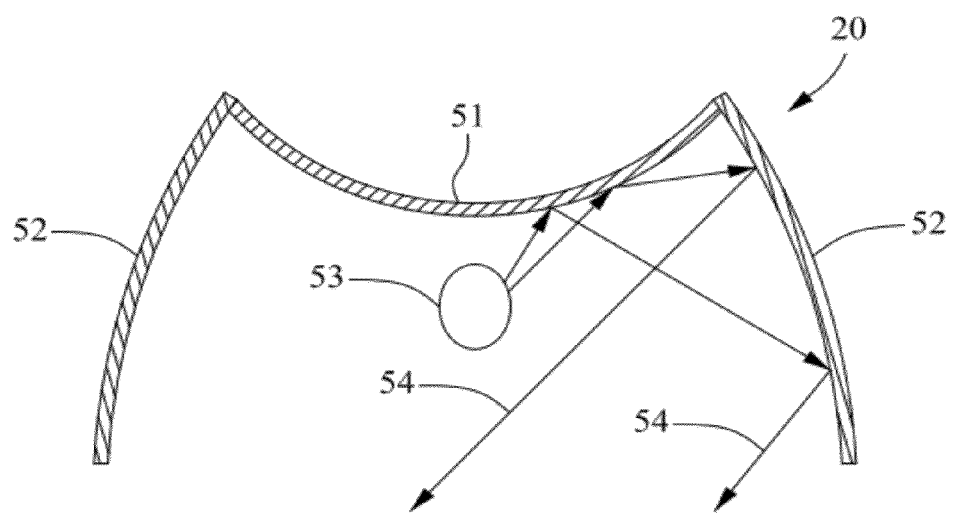
FIG. 2 is a structural diagram of a conventional reflector with negative focal length in U.S. Pat. Pub. No. 2006/0139933.
Figure 3:
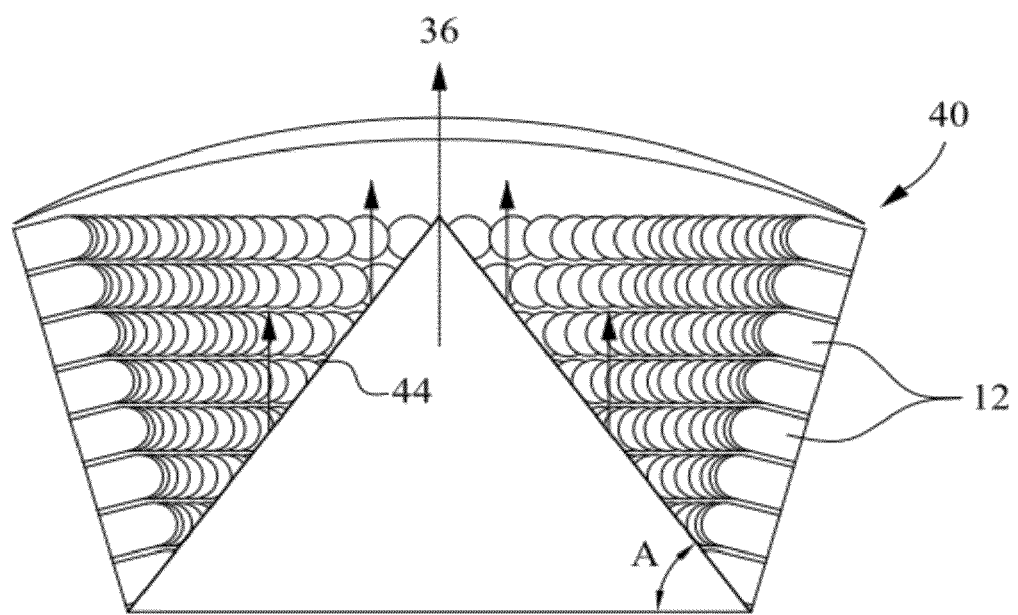
FIG. 3 is a structural diagram of a conventional lamp of a solid state light system in U.S. Pat. No. 5,838,247.
Figure 4:
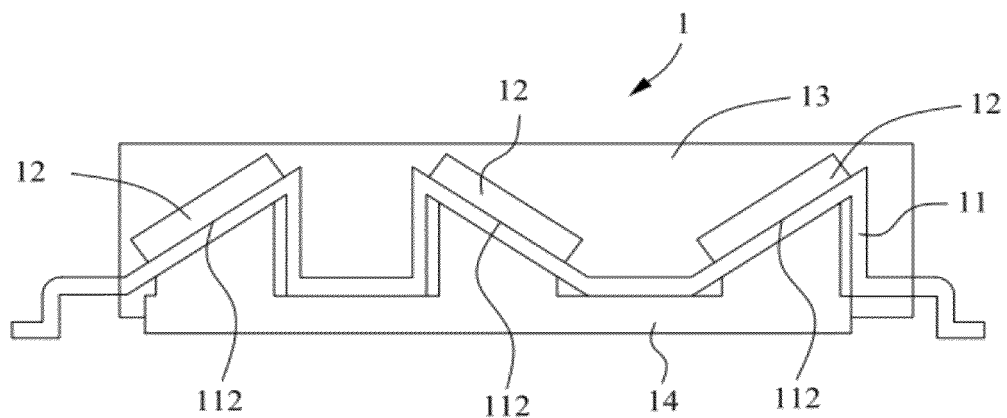
FIG. 4 is a cross-sectional diagram of a packaging structure for an LED module according to a first embodiment of the disclosure.

Please refer to FIG. 4, which is a cross-sectional diagram of a packaging structure for an LED module according to a first embodiment of the disclosure. The LED module 1 comprises a plurality of lead frames 11, each being bended by a predetermined angle according to a candela distribution curve to construct a tilted plane 112; and a plurality of LED chips 12, each being fixedly disposed on the tilted plane 112 constructed by each of the lead frames 11. The lead frames 11 comprise Cu, Fe, Ni or combination thereof. The LED chips 12 comprise semiconductor materials such as GaN, GaInN, AlInGaP, AlInGaN, AlN, InN, GaInAsN and GaInPN. The LED chips 12 are sapphire-based, thin-GaN LED's or flip-chip packaged. Moreover, each of the lead frames 11 is provided with a heat sink 14 at the bottom. The lead frames 11, LED chips 12 and the heat sink 14 are further covered by a transparent encapsulant 13.

Figure 5A:
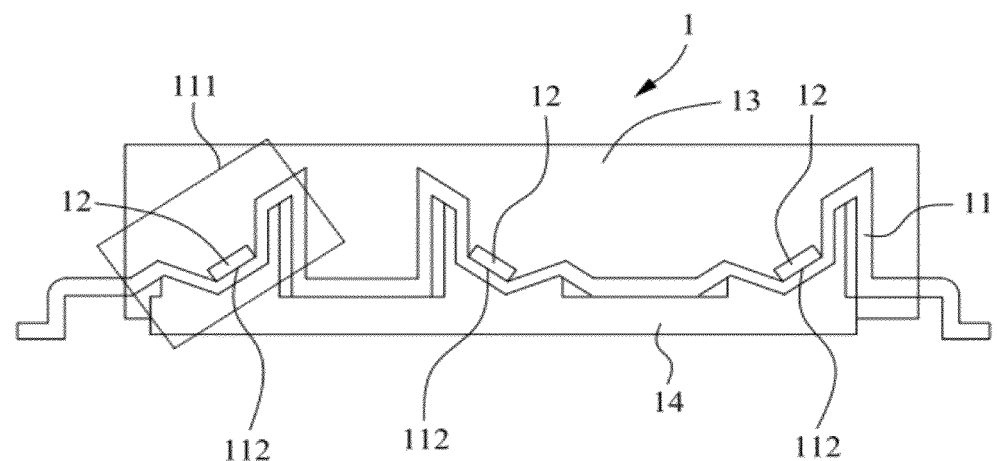
FIG. 5A is a cross-sectional diagram of a packaging structure for an LED module according to a second embodiment of the disclosure.

Please refer to FIG. 5A, which is a cross-sectional diagram of a packaging structure for an LED module according to a second embodiment of the disclosure. FIG. 5A is different from FIG. 4 in that the tilted plane 112 is recessed to form a cup 111 having a reflective surface so that the light from the LED chip 12 is more uniform than in FIG. 4.

Figure 5B:
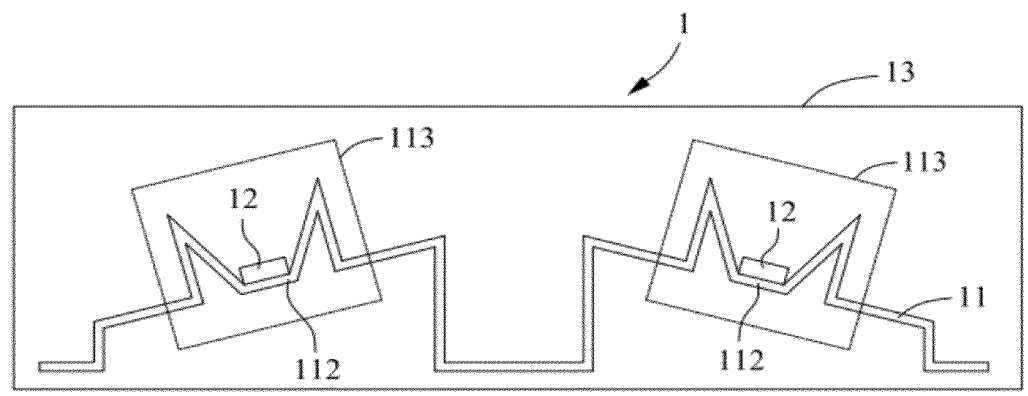
FIG. 5B is a cross-sectional diagram of a packaging structure for an LED module according to a third embodiment of the disclosure.
Figure 5C:
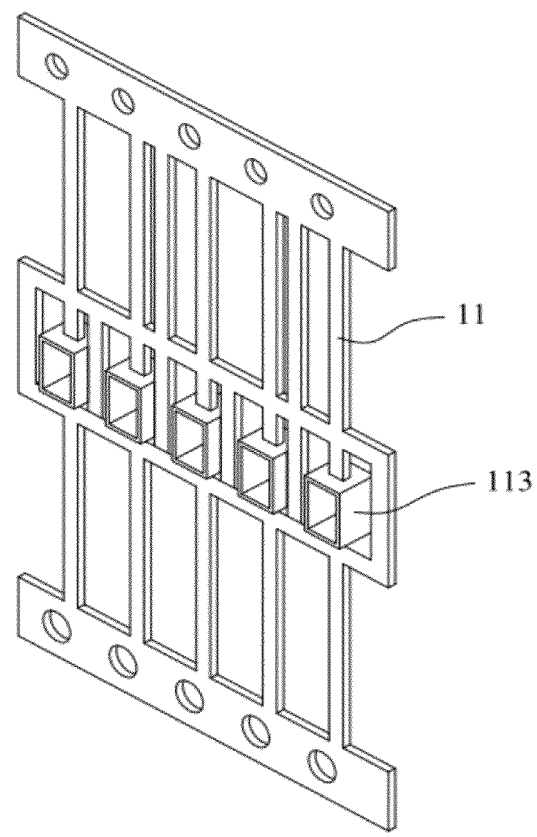
FIG. 5C is a three-dimensional diagram of a packaging structure for an LED module according to a fourth embodiment of the disclosure.

FIG. 5B is a cross-sectional diagram of a packaging structure for an LED module according to a third embodiment of the disclosure; and FIG. 5C is a three-dimensional diagram of a packaging structure for an LED module according to a fourth embodiment of the disclosure. In FIG. 5B and FIG. 5C, a cup 113 having a reflective surface protrudes from the tilted plane 112 so that the light from the LED chip 12 is more uniform. The cup 113 can be formed by injection molding.

Figure 6:
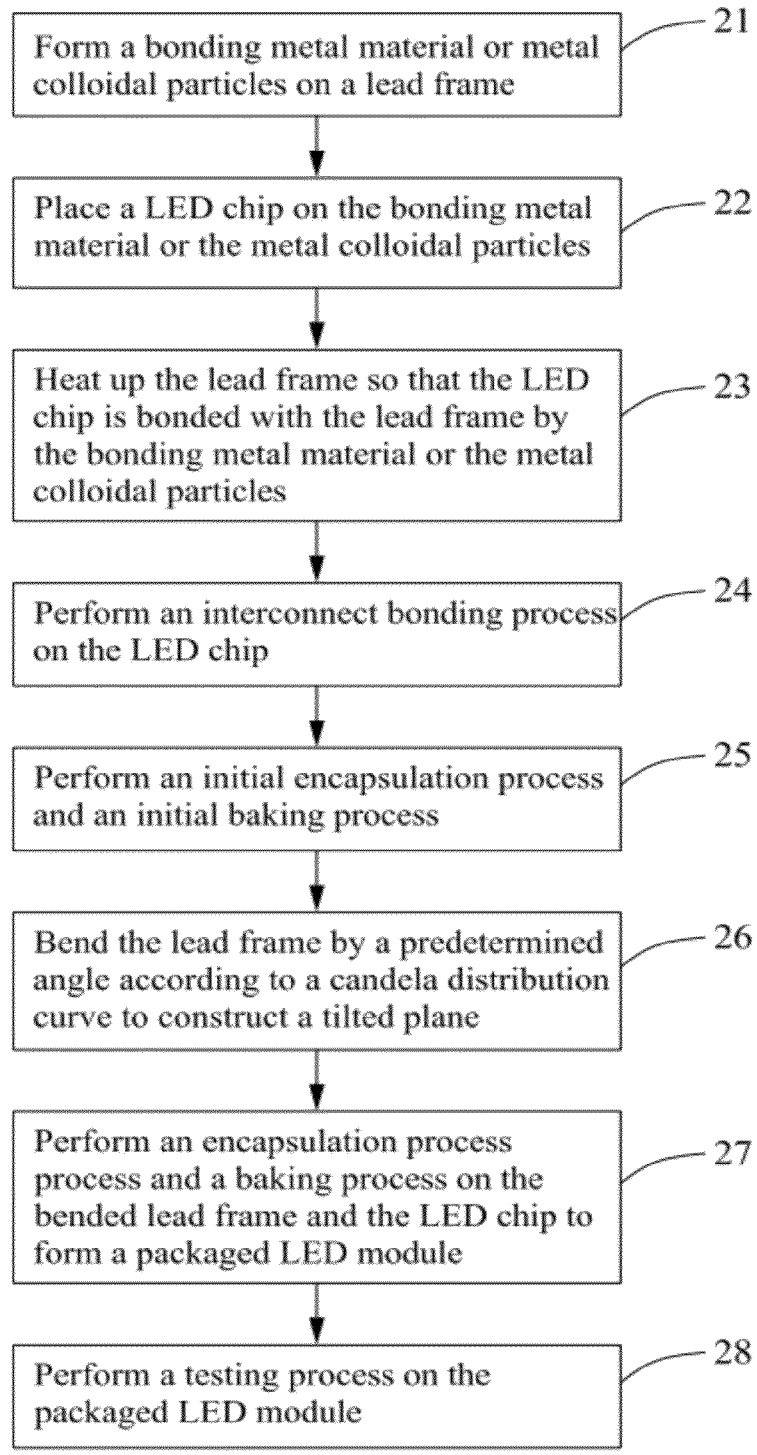
FIG. 6 is a flowchart of a LED packaging method according to a first embodiment of the disclosure.
Figure 7:
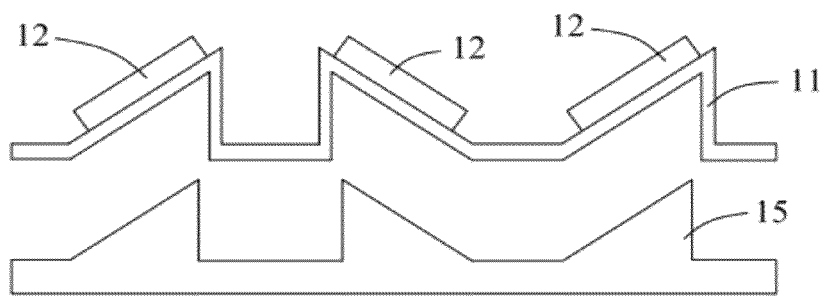
FIG. 7 is a cross-sectional diagram of a packaging structure for an LED module with a bended lead frame using a mold according to the disclosure.

Please refer to FIG. 6, which is a flowchart of a LED packaging method according to a first embodiment of the disclosure. Meanwhile, please refer to FIG. 7 for a cross-sectional diagram of a packaging structure for an LED module with a bended lead frame using a mold 15 according to the disclosure. The flowchart in FIG. 6 comprises steps herein:

In Step 21, a bonding metal material or metal colloidal particles are formed on a lead frame. The bonding metal material comprises single elements or alloys, such as Sn, Au, Au—Sn, Sn—Pb, Sn—Ag—Cu, Sn—Zn, Sn—Cu, Sn—Bi, In—Sn or combination thereof. The metal colloidal particles comprise a mixture of metal particles and polymer colloids, such as a silver paste, a copper paste or combination thereof formed by electroplating, screen printing, evaporation, sputtering or coating.

In Step 22, a LED chip is placed on the bonding metal material or the metal colloidal particles. To facilitate bonding, the back of the LED chip and the lead frame are coated by a metalization layer formed by Ti/Ni/Au, Al/Ni/Au, Cr/Ni/Au or combination thereof before the LED chip is bonded with the lead frame.

In Step 23, the lead frame is heated up so that the LED chip is bonded with the lead frame by the bonding metal material or the metal colloidal particles. The bonding metal or the metal colloidal particles are reacted with the metalization layer when the lead frame is heated up.

In Step 24, an interconnect bonding process is performed on the LED chip by flip-chip bonding or wire bonding. Flip-chip joints in flip-chip bonding comprise single elements or alloys such as Sn, Au, Au—Sn, Sn—Pb, Sn—Ag—Cu, Sn—Zn, Sn—Cu, Sn—Bi, In—Sn or combination thereof formed by electroplating, screen printing, evaporation, sputtering or coating. Metal leads in wire bonding comprise single metal elements or alloys such as Au, Al, Cu, Al—Si, Cu—Ag or combination thereof formed using hot-pressing, ultrasonic or hot-pressing ultrasonic.

In Step 25, an initial encapsulation process and an initial baking process are performed to prevent the LED chip and wiring from being bended before the lead frame is bended. In the initial encapsulation process, a transparent encapsulant is formed of epoxy or silicone in the initial encapsulation process. It is noted that, this step is optional so as to prevent the LED chip and wiring from being bended before the lead frame is bended.

In Step 26, the lead frame is bended by a predetermined angle according to a candela distribution curve to construct a tilted plane with the use of a mold.

In Step 27, an encapsulation process and a baking process are performed on the bended lead frame and the LED chip to form a three-dimensional LED module.

In Step 28, a testing process is performed on the three-dimensional LED module.

In view of the above, the LED packaging method of this disclosure is different from the conventional planar LED in that the lead frame is bended by a predetermined angle according to the candela distribution curve in Step 26. Therefore, the lighting orientation is determined by the predetermined angle to meet the requirements of a candela distribution curve without using any optical component.

Figure 8:
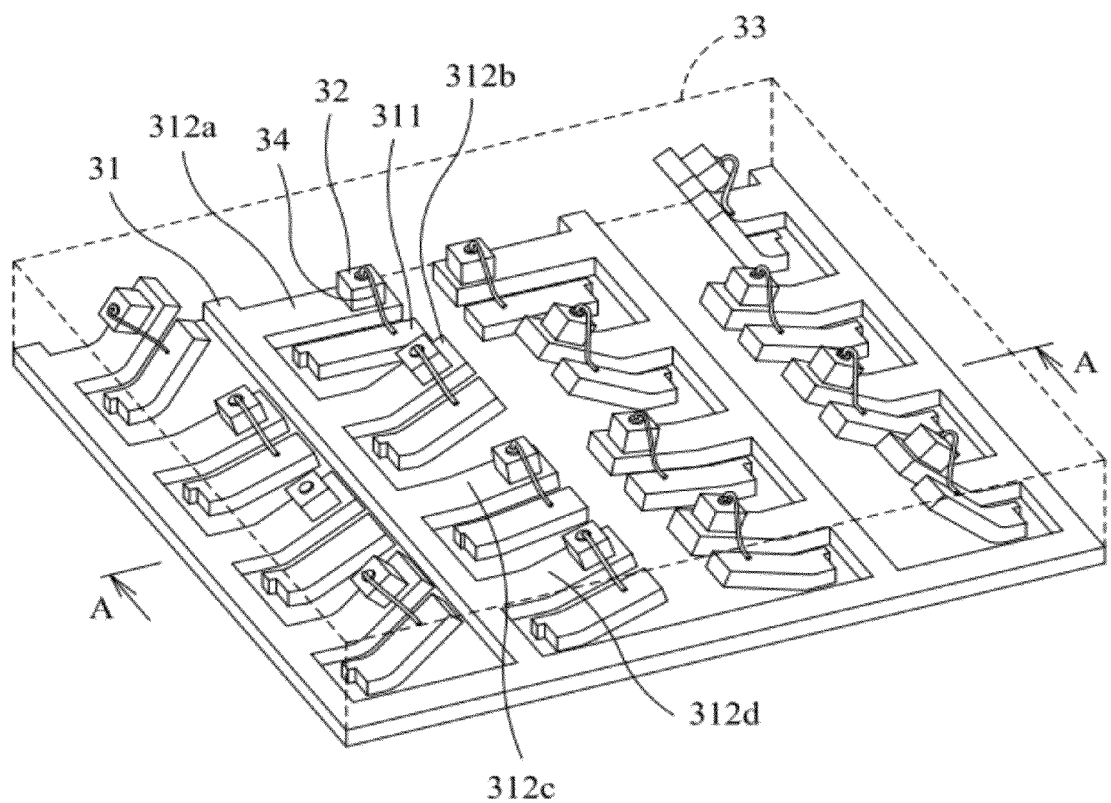
FIG. 8 is a three-dimensional diagram of a packaging structure for an LED module according to the disclosure.

Please refer to FIG. 8, which is a three-dimensional diagram of a packaging structure for an LED module according to the disclosure. In FIG. 8, the lead frame 31 is provided with a plurality of carriers 312a-312d. Each of the carriers 312a-312d is provided with a pin 311. Each of the carriers 312a-312d is extended from the lead frame 31 and is coupled thereto. The pin 311 is separated from the lead frame 31 and the carriers 312a-312d. Each of the carriers 312a-312d is provided with an LED chip 32, which is electrically coupled to the pin 311 by way of a wire 34 formed by a wire bonding process (i.e., the interconnect bonding process in Step 24 in FIG. 6). Therefore, an LED module is formed by covering the lead frame 31, the pin 311, the carriers 312a-312d, the LED chip 32 and the wire 34 with a transparent encapsulant 33. It is understood that, in the present embodiment, the LED packaging method achieves reducing the size of the LED lamp, manufacturing cost and improving the light-emitting efficiency. Moreover, in FIG. 8, it is to be determined whether the carriers 312a-312d are bended or not or how the carriers 312a-312d are bended according to practical use. In the present embodiment, the carrier 312a in FIG. 8 is not bended, while the carrier 312b is most inclinedly bended. The carriers 312b-312d are equivalent to the tilted planes 112 in FIG. 4, FIG. 5A and FIG. 5B, respectively. In addition to the carriers 312a-312d in FIG. 8, descriptions of other carriers are not presented though they are bended by different angles.

Even though the LED modules in FIG. 4, FIG. 5A to FIG. 5C and FIG. 8 are differently structured, they have things in common. For example, the carriers for carrying the LED chips, such as the tilted planes 112 in FIG. 4, FIG. 5A to FIG. 5C, and the carriers 312a-312d in FIG. 8, can be bended by an angle according to a candela distribution curve. In other words, the carriers can be disposed as a horizontal plane or bended by different angles. Moreover, when the LED modules are structured differently, the LED chips are bonded differently. For example, in FIG. 8, the LED chips 32 are bonded by way of wires 34 to be electrically coupled to the pins 311. Alternatively, the LED chips can be electrically coupled to the pin as described herein.

Figure 9A:
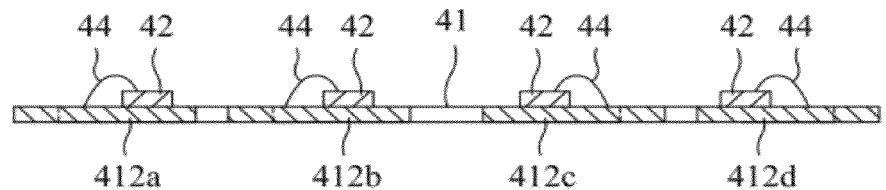
FIG. 9A to FIG. 9C are cross-sectional diagrams showing packaging steps of an LED module according to a fifth embodiment of the disclosure.
Figure 9B:
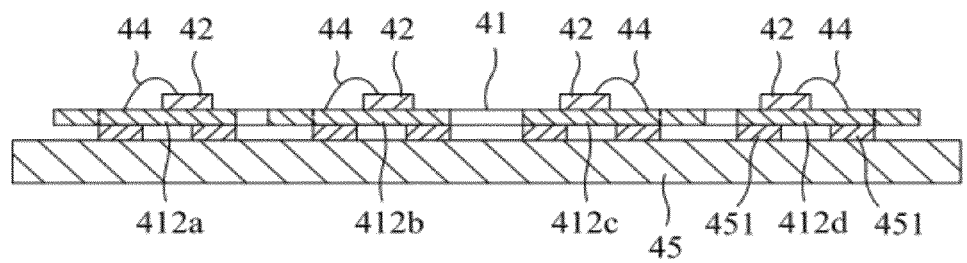
Figure 9C:
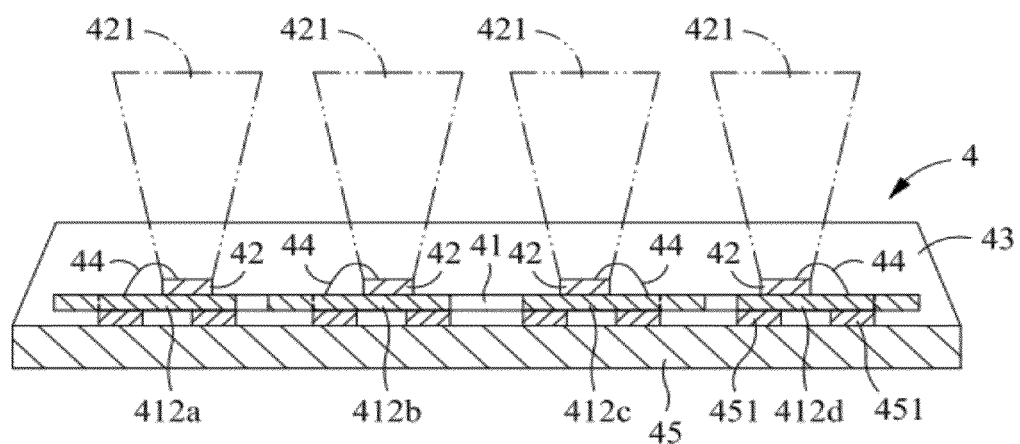

Referring to FIG. 9A to FIG. 9C, the lead frame 41 is viewed along the A-A line of the LED module in FIG. 8. In FIG. 9A, the carriers 412a-412d are not bended. An LED chip 42 is attached on each of the carriers 412a-412d by a silver paste, a solder or eutectic die attachment and is coupled to the joints (not shown) on the carriers 412a-412d by a wire 44 formed by wire bonding. Referring to FIG. 9B, the substrate 45 is provided with solder joints 451 thereon. The substrate 45 may comprise copper, aluminum or ceramic or be a printed circuit board. The solder joints 451 can be formed of a solder paste 451 by screen printing or a solder by electroplating. The lead frame 41 with the LED chip 42 and the wire 44 is further aligned with the substrate 45 and is heated up so that the lead frame 41 and the substrate 45 are bonded. The solder paste may be lead-free or lead-containing. The solder paste may be heated up by hot blast, infrared heating and hot plate heating. The framework of the lead frame 41 can be removed using a knife mold. The packaging structure in FIG. 9B undergoes an encapsulation process and a baking process to form an encapsulant 43 comprising epoxy or silicone. An LED module 4 can be packaged as shown in FIG. 9C. Since the carriers 412a-412d are not bended, the light 421 from the LED chips 42 is oriented the same. It is noted that the present embodiment only demonstrates a cross-sectional view of the lead frames. However, a 4×4 array of LED chips can be attached onto the lead frame as shown in FIG. 8. Similarly, a 5×5 or 6×6 array of LED chips can be used.

Accordingly, in this disclosure, a plurality of LED chips can be attached onto the lead frame and the alignment positions are determined during manufacturing. Therefore, the LED chips can be loaded on board rapidly and aligned by one operation to result in less deviation in the candela distribution curve. Moreover, the LED chips can be disposed inclinedly with adjustable angles. Therefore, a three-dimensional LED module can be formed according to this disclosure. Please refer to FIG. 10A to FIG. 10C and FIG. 11A to FIG. 11C for alternative embodiments.

Figure 10A:
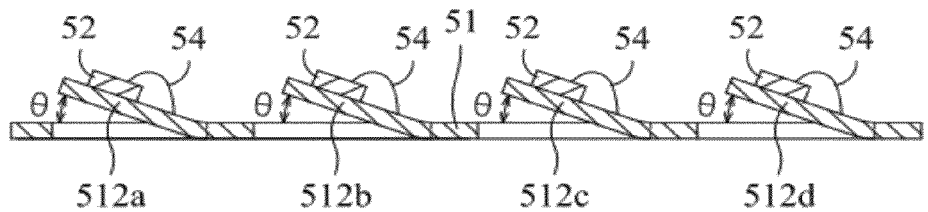
FIG. 10A to FIG. 10C are cross-sectional diagrams showing packaging steps of an LED module according to a sixth embodiment of the disclosure.
Figure 10B:
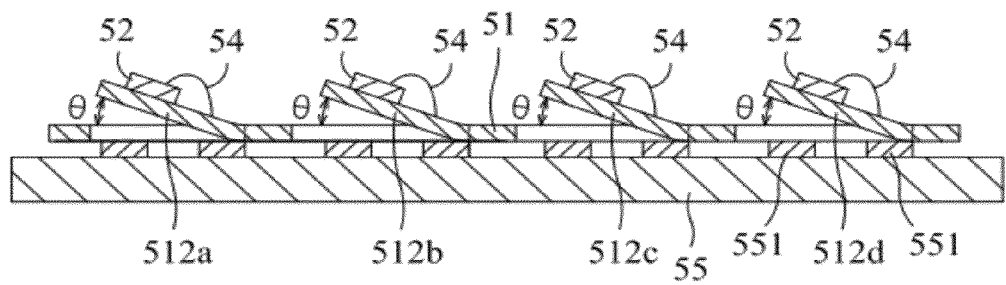
Figure 10C:
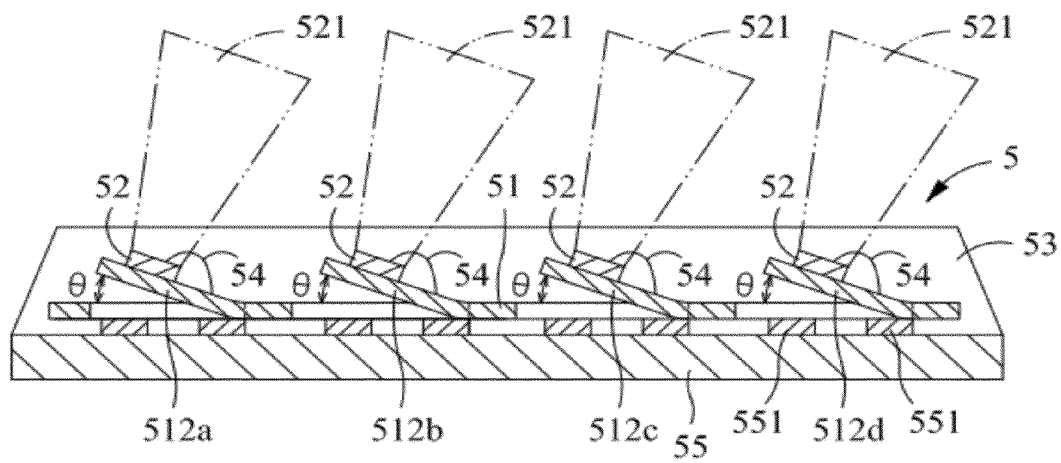

Referring to FIG. 10A to FIG. 10C, the lead frame 51 is provided with a plurality of carriers 512a-512d. Each of the carriers 512a-512d is provided with an LED chip 52, which is electrically coupled to joints (not shown) on the carriers 512a-512d by way of a wire 54 to construct a multi-chip lead frame as shown in FIG. 10A. The present embodiment is characterized in that the carriers 512a-512d are bended by a predetermined angle θ. Referring to FIG. 10B, solder joints 551 are formed on the substrate 55 to align the lead frame 51 (being provided with the LED chips 52 and the wire 54) with the substrate 55 so that the lead frame 51 and the substrate 55 are bonded after being heated up. The packaging structure in FIG. 10B undergoes an encapsulation process and a baking process to form an encapsulant 53. An LED module 5 can be packaged as shown in FIG. 10C.

Figure 11A:
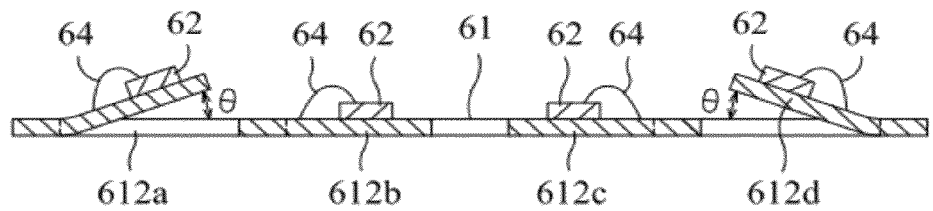
FIG. 11A to FIG. 11C are cross-sectional diagrams showing packaging steps of an LED module according to a seventh embodiment of the disclosure.
Figure 11B:
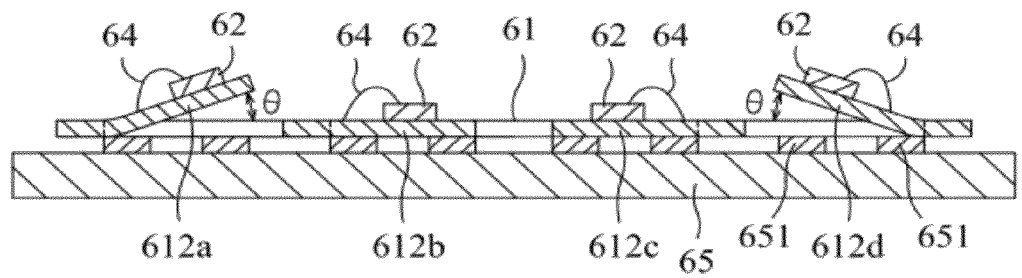
Figure 11C:
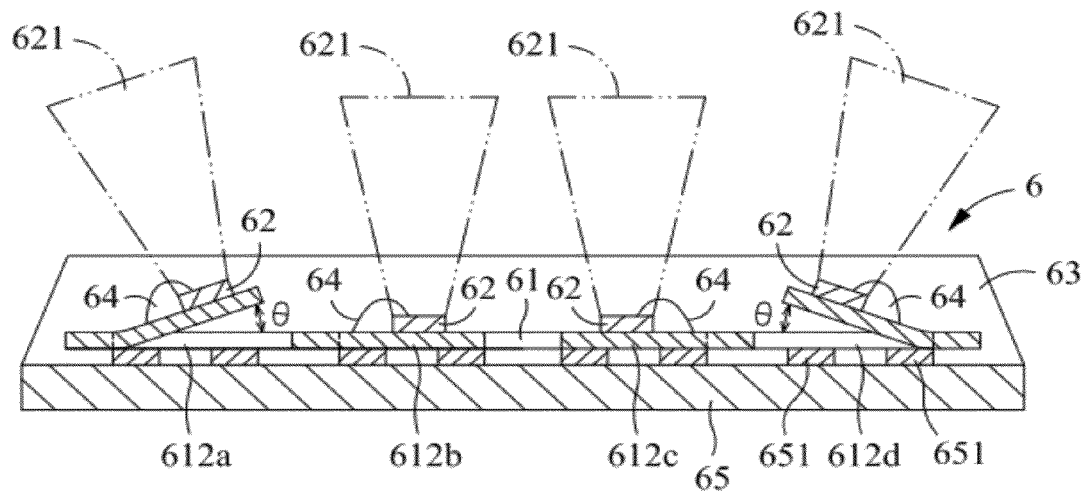

Referring to FIG. 11A to FIG. 11C, the lead frame 61 is provided with a plurality of carriers 612a-612d Each of the carriers 612a-612d is provided with an LED chip 62, which is electrically coupled to joints (not shown) on the carriers 612a-612d by way of a wire 64 to construct a multi-chip lead frame as shown in FIG. 11A. The present embodiment is characterized in that the outer carriers 612a, 612d are bended by a predetermined angle θ, while the inner carriers 612b, 612c are not bended. Referring to FIG. 11B, solder joints 651 are formed on the substrate 65 to align the lead frame 61 (being provided with the LED chips 62 and the wire 64) with the substrate 65 so that the lead frame 61 and the substrate 65 are bonded after being heated up. The packaging structure in FIG. 11B undergoes an encapsulation process and a baking process to form an encapsulant 63. A multi-chip LED module 6 can be packaged as shown in FIG. 11C. Since the outer carriers 612a, 612d are inclined outwards by an angle θ, the light 621 from the LED module 6 exhibits a wider light-emitting range.

Accordingly, this disclosure provides various embodiments as described herein.

In FIG. 4, the lead frame is bended by at least two different angles and is provided with a heat sink at the bottom.

In FIG. 5A, the lead frame is bended to be recessed with cups inclined by at least two different angles and is provided with a heat sink at the bottom.

In FIG. 5B, the lead frame is bended to form protruding cups inclined by at least two different angles.

In FIG. 5C, the lead frame is not bended and is provided with cups.

In FIG. 9A, the lead frame is not bended and is planar.

In FIG. 10A, the lead frame is bended by the same angle.

In FIG. 8 and FIG. 11A, the lead frame is partially bended and partially unbended.

Figure 12A:
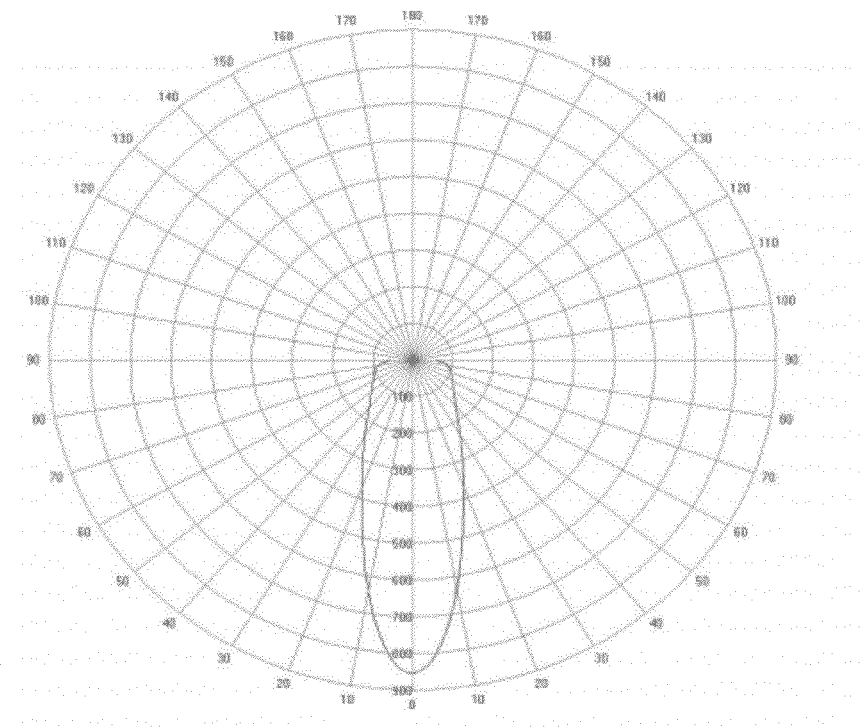
FIG. 12A is a graph showing a distribution of light emitted from an LED module (FIG. 5C) according to a fourth embodiment of the disclosure.
Figure 12B:
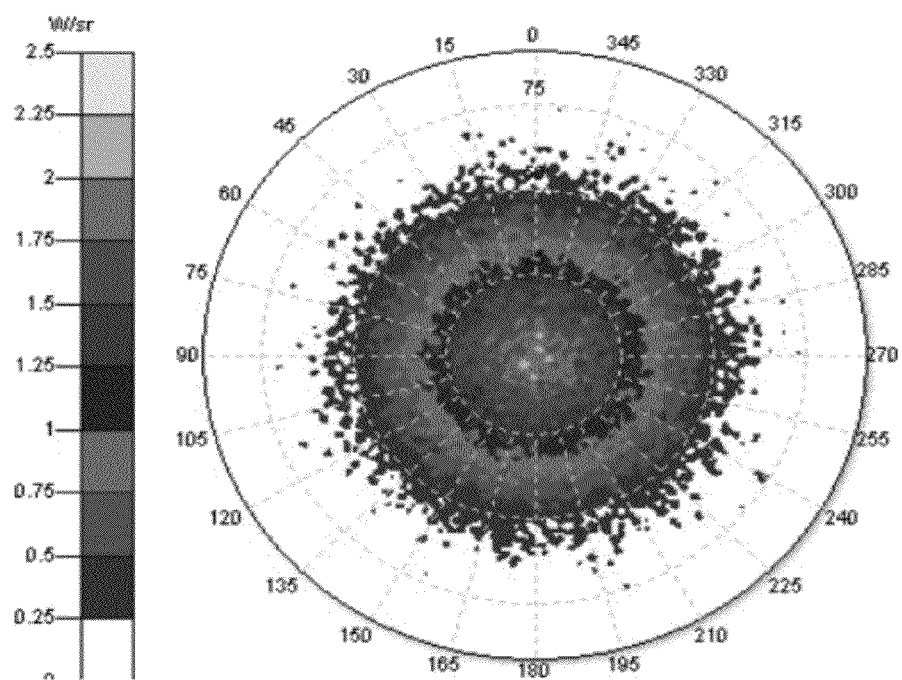
FIG. 12B is a graph showing a distribution of illumination of an LED module (FIG. 5C) according to a fourth embodiment of the disclosure.
Figure 13A:
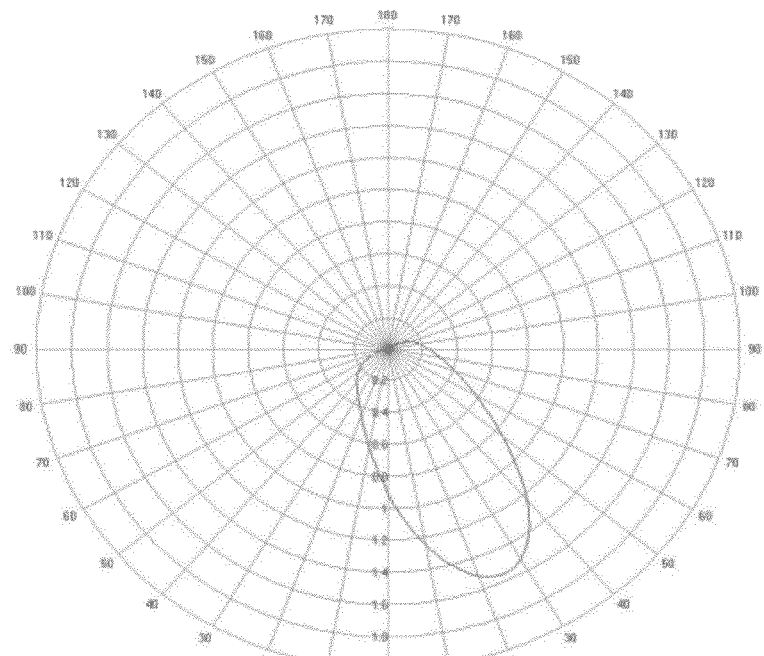
FIG. 13A is a graph showing a distribution of light emitted from an LED module (FIG. 10A to FIG. 10C) according to a sixth embodiment of the disclosure.
Figure 13B:
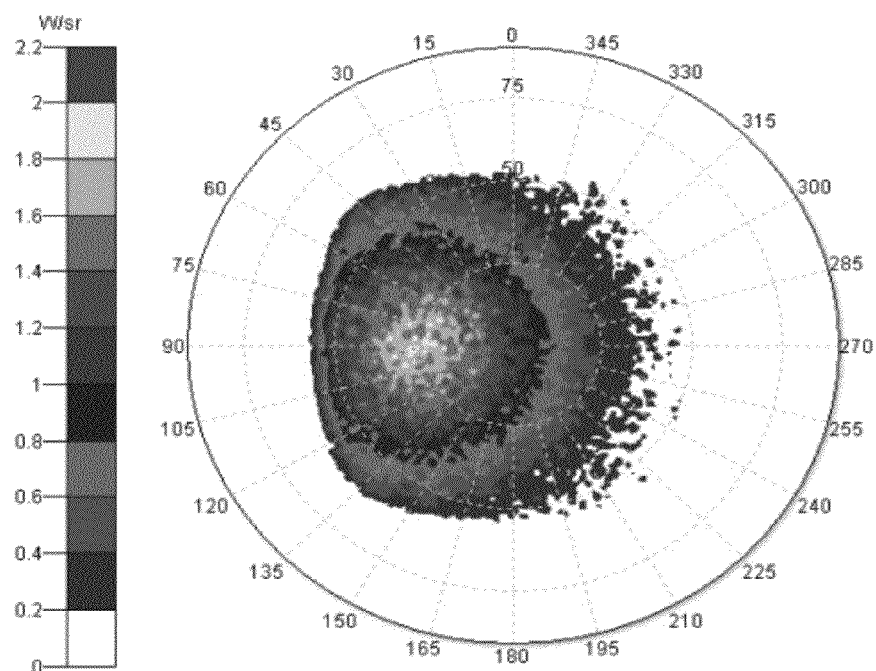
FIG. 13B is a graph showing a distribution of illumination of an LED module (FIG. 10A to FIG. 10C) according to a sixth embodiment of the disclosure.
Figure 14A:
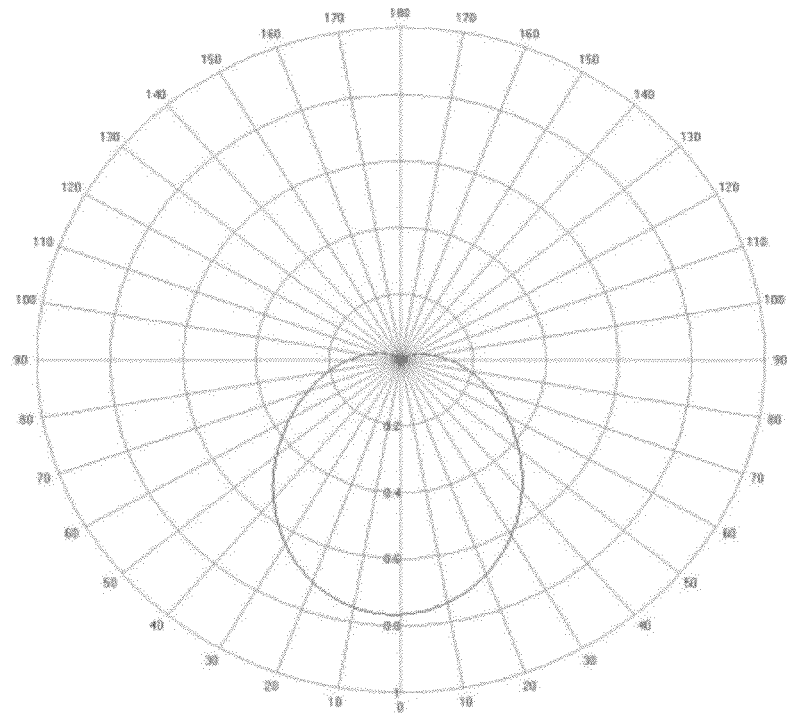
FIG. 14A is a graph showing a distribution of light emitted from an LED module (FIG. 11A to FIG. 11C) according to a seventh embodiment of the disclosure.
Figure 14B:
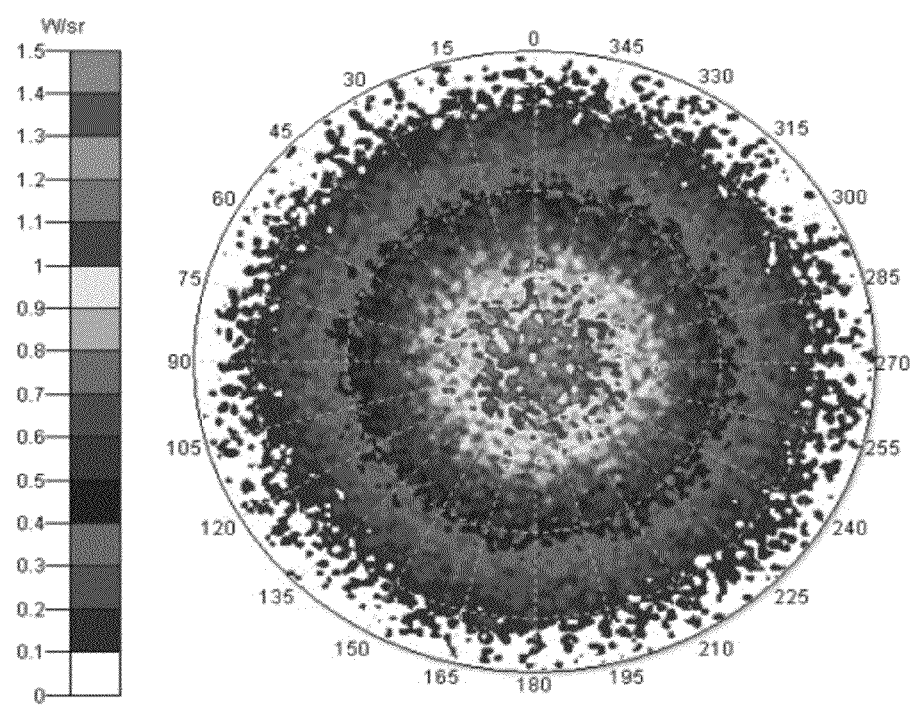
FIG. 14B is a graph showing a distribution of illumination of an LED module (FIG. 11A to FIG. 11C) according to a seventh embodiment of the disclosure.

FIG. 12A is a graph showing a distribution of light emitted from an LED module (FIG. 5C) according to a fourth embodiment of the disclosure. The light distribution is narrow and the distribution of illumination is as shown in FIG. 12B. Moreover, FIG. 13A is a graph showing a distribution of light emitted from an LED module (FIG. 10A to FIG. 10C) according to a sixth embodiment of the disclosure. Compared to FIG. 12A, the light distribution in FIG. 13A is inclined and the distribution of illumination is as shown in FIG. 13B. FIG. 14A is a graph showing a distribution of light emitted from an LED module (FIG. 11A to FIG. 11C) according to a seventh embodiment of the disclosure. Compared to FIG. 12A, the light distribution in FIG. 14A is wider and the distribution of illumination is as shown in FIG. 14B.

Figure 15:
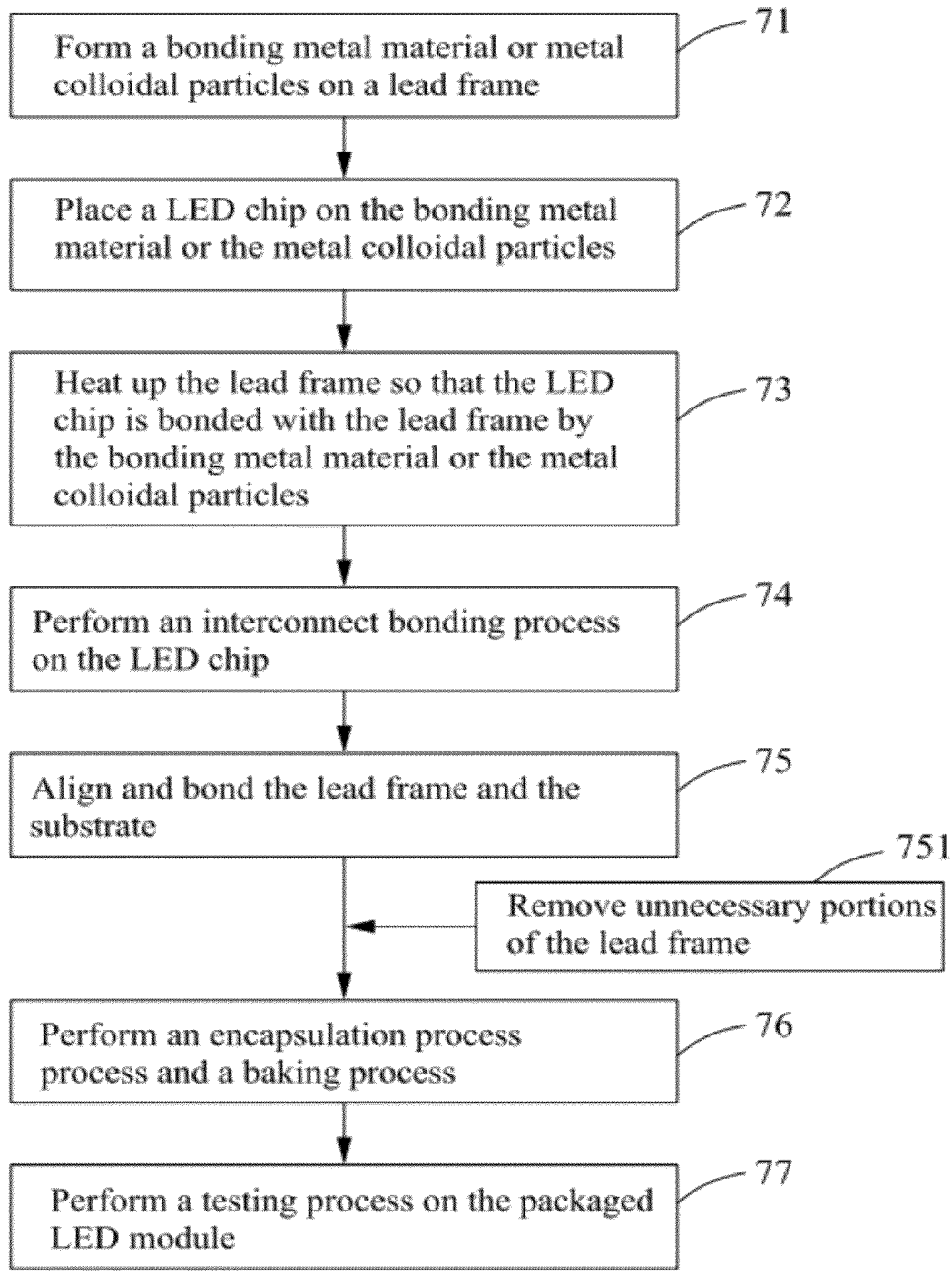
FIG. 15 is a flowchart of a LED packaging method according to a fifth embodiment (FIG. 9A to FIG. 9C) of the disclosure.

FIG. 15 is a flowchart of a LED packaging method according to a fifth embodiment (FIG. 9A to FIG. 9C) of the disclosure. The flowchart in FIG. 15 comprises steps herein:

In Step 71, a bonding metal material or metal colloidal particles are formed on a lead frame. The bonding metal material comprises single elements or alloys, such as Sn, Au, Au—Sn, Sn—Pb, Sn—Ag—Cu, Sn—Zn, Sn—Cu, Sn—Bi, In—Sn or combination thereof. The metal colloidal particles comprise a mixture of metal particles and polymer colloids, such as a silver paste, a copper paste or combination thereof formed by electroplating, screen printing, evaporation, sputtering or coating.

In Step 72, a LED chip is placed on the bonding metal material or the metal colloidal particles. To facilitate bonding, the back of the LED chip and the lead frame are coated by a metalization layer formed by Ti/Ni/Au, Al/Ni/Au, Cr/Ni/Au or combination thereof before the LED chip is bonded with the lead frame.

In Step 73, the lead frame is heated up so that the LED chip is bonded with the lead frame by the bonding metal material or the metal colloidal particles. The bonding metal or the metal colloidal particles are reacted with the metalization layer when the lead frame is heated up.

In Step 74, an interconnect bonding process is performed on the LED chip by flip-chip bonding or wire bonding. Flip-chip joints in flip-chip bonding comprise single elements or alloys such as Sn, Au, Au—Sn, Sn—Pb, Sn—Ag—Cu, Sn—Zn, Sn—Cu, Sn—Bi, In—Sn or combination thereof formed by electroplating, screen printing, evaporation, sputtering or coating. Metal leads in wire bonding comprise single metal elements or alloys such as Au, Al, Cu, Al—Si, Cu—Ag or combination thereof formed using hot-pressing, ultrasonic or hot-pressing ultrasonic.

In Step 75, the lead frame and the substrate aligned and bonded after the die attachment process, the wire bonding process.

In Step 76, an encapsulation process and a baking process are performed on the lead frame and the substrate to form an LED module. A stamping machine is used to form a transparent encapsulant in the initial encapsulation process.

In Step 77, a testing process is performed on the LED module.

The flowchart in FIG. 15 further comprises a step 751 of removing a framework of the lead frame after Step 75. More particular, the framework can be removed by a knife mold.

The above Step 71 and Step 77 are performed on unbended lead frame as shown in FIG. 9A. For lead frames that need to be bended as shown in FIG. 4, FIG. 5A, FIG. 5B, FIG. 7, FIG. 8, FIG. 10A, FIG. 11A, a step of bending is required, as shown in the flowchart in FIG. 16.

In Step 81, a bonding metal material or metal colloidal particles are formed on a lead frame. The bonding metal material comprises single elements or alloys, such as Sn, Au, Au—Sn, Sn—Pb, Sn—Ag—Cu, Sn—Zn, Sn—Cu, Sn—Bi, In—Sn or combination thereof. The metal colloidal particles comprise a mixture of metal particles and polymer colloids, such as a silver paste, a copper paste or combination thereof formed by electroplating, screen printing, evaporation, sputtering or coating.

In Step 82, an LED chip is placed on the bonding metal material or the metal colloidal particles. To facilitate bonding, the back of the LED chip and the lead frame are coated by a metalization layer formed by Ti/Ni/Au, Al/Ni/Au, Cr/Ni/Au or combination thereof before the LED chip is bonded with the lead frame.

In Step 83, the lead frame is heated up so that the LED chip is bonded with the lead frame by the bonding metal material or the metal colloidal particles. The bonding metal or the metal colloidal particles are reacted with the metalization layer when the lead frame is heated up.

In Step 84, an interconnect bonding process is performed on the LED chip by flip-chip bonding or wire bonding. Flip-chip joints in flip-chip bonding comprise single elements or alloys such as Sn, Au, Au—Sn, Sn—Pb, Sn—Ag—Cu, Sn—Zn, Sn—Cu, Sn—Bi, In—Sn or combination thereof formed by electroplating, screen printing, evaporation, sputtering or coating. Metal leads in wire bonding comprise single metal elements or alloys such as Au, Al, Cu, Al—Si, Cu—Ag or combination thereof formed using hot-pressing, ultrasonic or hot-pressing ultrasonic.

In Step 85, the lead frame is bended by a predetermined angle according to a candela distribution curve to construct a tilted plane by bending lead frame by a predetermined angle with the use of a mold.

In Step 86, the lead frame and the substrate aligned and bonded after the die attachment process, the wire bonding process.

In Step 87, an encapsulation process and a baking process are performed on the lead frame and the substrate to form a three-dimensional LED module. A stamping machine is used to form a transparent encapsulant in the initial encapsulation process.

In Step 88, a testing process is performed on the three-dimensional LED module.

Figure 16:
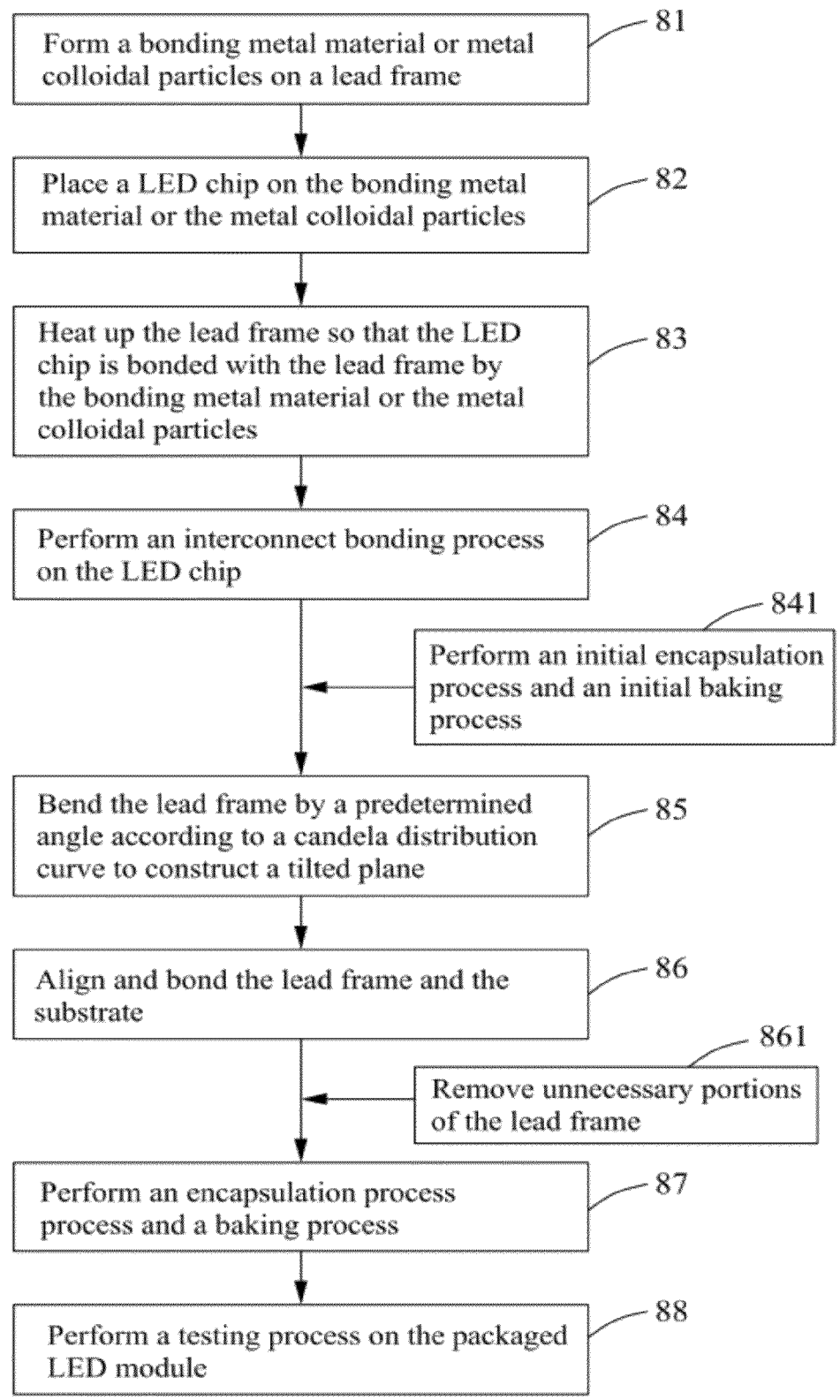
FIG. 16 is a flowchart of a LED packaging method according to a sixth embodiment (FIG. 11A to FIG. 11C) of the disclosure.

Similarly, the flowchart in FIG. 16 further comprises a step 861 of removing a framework of the lead frame after Step 86. More particular, the framework can be removed by a knife mold.

Moreover, to prevent the LED chip and wiring from being bended before the lead frame is bended, an initial encapsulation process and an initial baking process are performed in Step 841. In the initial encapsulation process, a transparent encapsulant is formed of epoxy or silicone in the initial encapsulation process. With Step 841, Step 87 performs a second encapsulation process and a second baking process.

Accordingly, this disclosure can be widely applied. By the use of an array of tilted planes on the lead frame, the light distribution can be oriented towards a direction or inwards or outwards to exhibit various light distributions over different ranges. Compared to conventional LED modules, the LED module in this disclosure exhibits higher performances with more flexibility.

In view of FIG. 4 to FIG. 16, it is readily understood that the disclosure relates to a light-emitting diode (LED) module and an LED packaging method. As the LED module is packaged under the consideration of candela distribution, each of the lead frames of the LED chips packaged in the LED module is bended for tilting the LED chips by different angles to exhibit various lighting effects without using additional light control elements. Meanwhile, in the LED packaging method, a plurality of LED chips can be loaded on board rapidly and aligned by one operation to result in less deviation in the candela distribution curve.

Although this disclosure has been disclosed and illustrated with reference to particular embodiments, the principles involved are susceptible for use in numerous other embodiments that will be apparent to persons skilled in the art. This disclosure is, therefore, to be limited only as indicated by the scope of the appended claims.

What is claimed is:

1. An LED module, comprising:
   a plurality of lead frames;
   a plurality of carriers, each of the carriers extended from the lead frames and coupled thereto, wherein at least one of the carriers is bended by a predetermined angle according to a candela distribution curve to construct a tilted plane, and each carrier shows different predetermined angles separately; and
   a plurality of LED chips, each being fixedly disposed on the tilted plane constructed by each of the carriers.

2. The LED module as recited in claim 1, wherein the tilted plane is recessed to form a cup having a reflective surface.

3. The LED module as recited in claim 1, wherein a cup having a reflective surface protrudes from the tilted plane.

4. The LED module as recited in claim 1, wherein the lead frames and the LED chips are covered by a transparent encapsulant.

5. The LED module as recited in claim 1, wherein the tilted plane is tilted inwards or outwards.

6. The LED module as recited in claim 1, wherein each of the lead frames is provided with a heat sink at the bottom.

7. An LED module, comprising:
   a plurality of lead frames;
   a plurality of carriers, each of the carriers extended from the lead frames and coupled thereto, wherein at least one of the carriers is bended by a predetermined angle according to a candela distribution curve to construct a tilted plane, and each carrier shows different predetermined angle separately;
   a plurality of LED chips, each being fixedly disposed on the tilted plane constructed by each of the carriers; and
   a substrate, being disposed under and electrically coupled to the lead frames.

8. The LED module as recited in claim 7, wherein each of the lead frames is bended by a predetermined angle according to a candela distribution curve to construct a tilted plane.

9. The LED module as recited in claim 8, wherein the tilted plane is recessed to form a cup having a reflective surface.

10. The LED module as recited in claim 8, wherein a cup having a reflective surface protrudes from the tilted plane.

11. The LED module as recited in claim 8, wherein the tilted plane is tilted inwards or outwards.

12. The LED module as recited in claim 7, wherein the lead frames and the LED chips are covered by a transparent encapsulant.

* * * * *